United States Patent [19]

Pryor

[11] 4,408,245
[45] Oct. 4, 1983

[54] PROTECTION AND ANTI-FLOATING NETWORK FOR INSULATED-GATE FIELD-EFFECT CIRCUITRY

[75] Inventor: Richard L. Pryor, Voorhees, N.J.

[73] Assignee: RCA Corporation, New York, N.Y.

[21] Appl. No.: 334,819

[22] Filed: Dec. 28, 1981

[51] Int. Cl.³ .............................................. H02H 9/04
[52] U.S. Cl. ....................................... 361/56; 361/91;
361/100; 361/101; 307/200 B; 357/23
[58] Field of Search ................... 361/100, 101, 56, 90,
361/91, 92; 307/200 B; 357/23 GP

[56] References Cited

U.S. PATENT DOCUMENTS 3,675,144  7/1972  Zuk ........................................ 330/40
4,001,606  1/1977  Dingwall ..................... 307/247 R X
4,037,114  7/1977  Stewart et al. ....................... 307/473
4,037,140  7/1977  Eaton, Jr. ............................... 361/56

Primary Examiner—Reinhard J. Eisenzopf
Attorney, Agent, or Firm—Joseph S. Tripoli; Henry I. Schanzer

[57] ABSTRACT

A first IGFET functioning as a pull-up or pull-down transistor is formed in parallel with one of a pair of gated diodes. The first IGFET-diode combination is connected to the gate electrode of a second IGFET to which is connected an external (off chip) signal source. In one mode of operation, the first IGFET is turned-on in response to a control signal and operates as a current path to prevent the gate of the second IGFET from floating in the event of an open circuit. In a second mode of operation, the second IGFET is turned-off in response to a control signal. The diode portion of the combination operates to protect the gate electrode of the second IGFET from any over voltage.

9 Claims, 6 Drawing Figures 4,408,245

PROTECTION AND ANTI-FLOATING NETWORK FOR INSULATED-GATE FIELD-EFFECT CIRCUITRY

The Government has rights in this invention pursuant to Sub-Contract No. Raytheon PO #53-0075-SX-98005 under contract No. u/FO 4701-75-C-0149 awarded by the Department of the Air Force.

This invention relates to means for protecting the gate electrode of an insulated-gate field-effect transistor (IGFET) and for preventing the gate electrode of the IGFET from floating in the event of an open circiut.

Insulated-gate field-effect transistors (IGFETs) have a high input impedance due to the presence of an insulator layer over the conduction channel between the gate electrode and the substrate. To operate the transistor at practical voltage levels, the insulator layer has to be made relatively thin. If a large potential is applied across this thin insulator layer, the layer can rupture, causing a short circuit between the gate and the substrate which usually results in catastrophic failure of the transistor.

The presence of a high voltage at the gate of a transistor may be due to an input signal of large amplitude, or to the accumulation of static charge on the gate. Because of the high input impedance of the transistor (typically, the input resistance is greater than $10^{14}$ ohms and the input capacitance is in the order of $10^{-12}$ farads) even a small static charge on the gate is translated into a high potential.

To prevent the rupture of the gate insulator of an IGFET, due to excessive potentials applied to its gate electrode, it is known to have a protection network which includes first and second diodes connected anode to cathode (i.e. in series) between the two power supply terminals across which an operating potential is applied for powering the IGFET circuit, and to connect the gate electrode of the IGFET to the common connection between the two diodes. It is also knon that the insulation between the gate and the epitaxial island is weaker in regions where the poly gate is allowed to pass over the edge of the epitaxial island, and hence even more subject to rupture. To prevent such rupture on sensitive input pads all gates attached to them should be annular.

In addition to the diode (rupture) protection, it is often necessary and/or desirable to prevent the gate from floating in the event of an open circuit between the gate and an input signal source. Typically, the gate electrode of the diode protected IGFET is coupled to a signal input terminal, and an external conductor carrying a signal is connected to the signal input terminal. Because of the extremely high input impendance of the IGFET when the external conductor develops an open circuit the voltage at the input terminal and at the gate electrode may float and vary erratically between the operating voltages at the two power supply terminals. This results in the production of undefined and erroneous (e.g. high frequency noise) conditions at the output of the IGFET. The problem may be resolved by connecting either a "pull-up" element exhibiting a given impedance between the gate electrode and the most positive operating voltage or a "pull-down" element exhibiting a given impedance between the gate electrode and the most negative operating voltage. When an open circuit occurs, the pull-down or pull-up element must be capable of passing sufficient current to hold the input terminal either at the lowest operating potetial (e.g. ground) or at the highest operating potential (e.g. $V_{DD}$). However, under normal conditions, in the absence of an open circuit, when a signal source is coupled to the input terminal, the pull-up or pull-down element should not load down the signal significantly. Hence, a problem exists in that the pull-up or pull-down element must exhibit a relatively high effective impedance while still being capable of effectively pulling the gate elctrode to a "high" or "low" operating potential.

Where the need exists for both an anti-rupture protection circuit and an anti-floating circuit for each IGFET whose gate electrode is connected to an input terminal, a sizable amount of additional chip area is needed. This is a particularly serious problem in integrated circuits (IC's) having a multiplicity of input terminals because the amount of area required for the input protection and control may become excessive, severely limiting the number of functions that can be formed on the ICs. If a separate pull-up or pull-down device is connected in parallel with the gated diode, the two devices will have two separate annular gate structures which is space consuming, and results in an undesired low impedance for the pull-up or pull-down device.

The above problems are resolved in circuits embodying the invention by making the pull-up or pull-down element a transistor which is formed as part of, and within essentially the same area as, one of the protection diodes.

In the accompanying drawing like reference characters denote like components, and FIG. 1 is a schematic diagram of a circuit embodying the invention;

Figure 1:
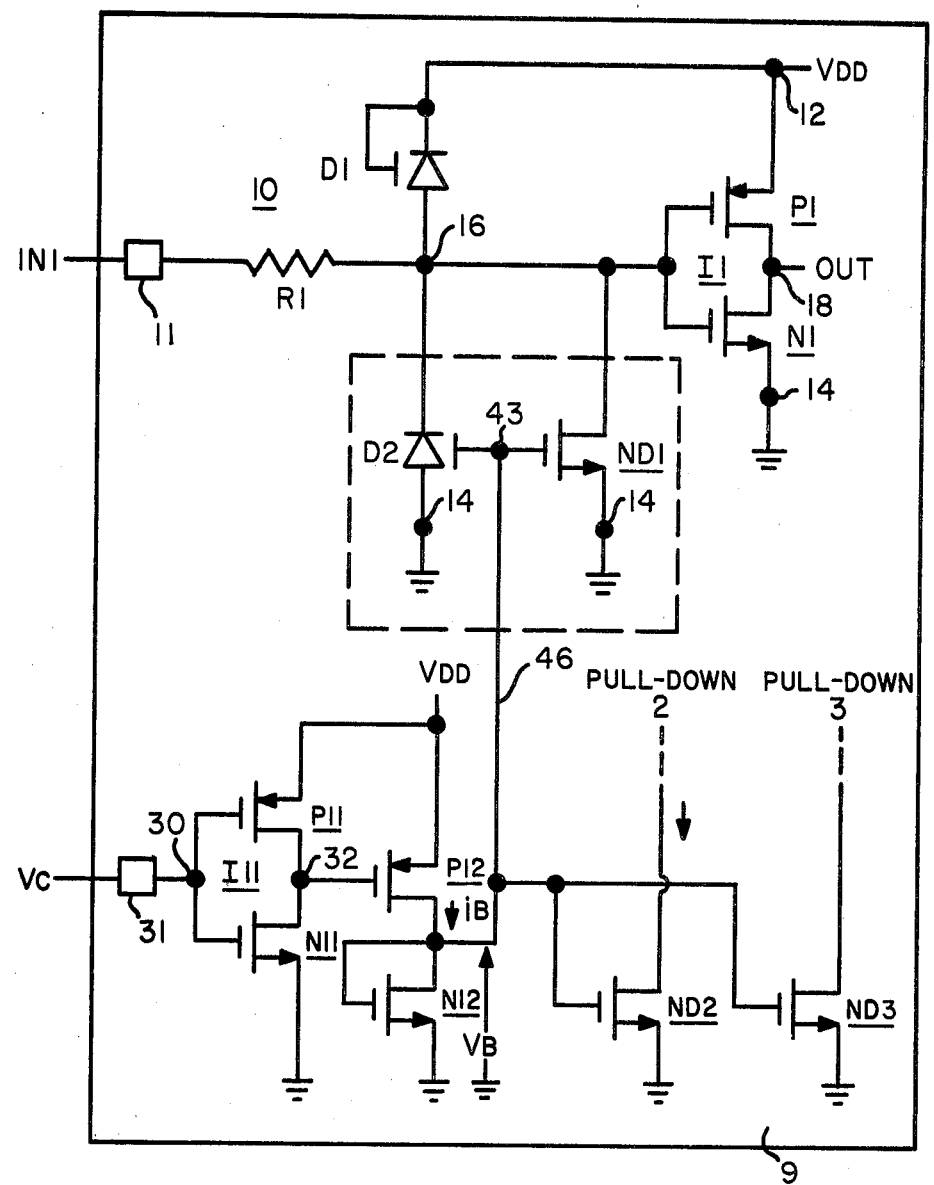

In the discussion to follow, insulated-gate field-effect transistors (IGFETs) are used to illustrate the invention. IGFETs of P conductivity are denoted by the letter P followed by a particular reference character and IGFETs of N conductivity are denoted by the letter N followed by a particular reference character. Characteristics of IGFETs are described, for example, in detail in U.S. Pat. Nos. 4,037,114 and 4,001,606 and are incorporated herein by reference.

FIG. 1 shows an integrated circuit 9 which includes a multiplicity of circuits 10, each having an input terminal or bonding pad 11. The latter is connected via a resistor R1 to an input node 16 to which is connected the gate electrodes of IGFETs P1 and N1 which are interconnected to form a complementary inverter I1. The sources of IGFETs P1 and N1 are connected to terminals 12 and 14, respectively, and their drains are connected to an output node 18. To operate the circuit, an operating potential of $+V_{DD}$ volts is applied to terminal 12 and ground (0 volt) is applied to terminal 14, with $+V_{DD}$ being more positive than ground.

The gate insulators of P1 and N1 are protected, in part, by means of gated diodes D1 and D2 and the gate electrodes of P1 and N1 are prevented from floating by means of a pull-down IGFET ND1. Gate controlled (gated) diode D1 is connected at its anode to node 16 and at its cathode to terminal 12 and gated diode D2 is connected at its anode to terminal 14 and at its cathode to node 16. That diodes D1 and D2 are gated diodes is illustrated by means of a gate electrode positioned adjacent each diode between its anode and cathode. The gate electrode of diode D1 is returned to its cathode. The gate electrode 43 of diode D2 is common to the gate electrode 43 of pull-down transistor ND1 with a bias voltage ($V_B$) being applied to both. The importance of having the gate electrode of D2 common to the gate electrode of IGFET ND1 is detailed below.

The bias voltage ($V_B$) applied to the gate electrodes of D2 and ND1 is derived from a bias network comprised of a control inverter I11 whose input 30 is connected to a control voltage ($V_C$) terminal 31 and whose output 32 is connected to the gate electrode of a current sourcing IGFET P12. The source electrode of P12 is connected to $V_{DD}$ and its drain electrode is connected to the gate and drain electrodes of IGFET N12 whose source electrode is returned to ground. P12 is a small device functioning as a high impedance resistor limiting the current $i_B$ into the source-to-drain path of IGFET N12. The voltage ($V_{GS}=V_{DS}$) developed between the gate/drain and source of N12 (for the $i_B$ flowing between drain and source) defines the bias voltage ($V_B$) generated at the drain of N12. The voltage $V_B$ is then applied to the gate electrodes of the pull-down transistors, NDi, whose sources are connected to ground and whose drains like that of ND1 are connected to the gate electrodes of selected input IGFETs; (The pull-down transistors are identified as NDi, where "i" is a numeral identifying a particular pull-down transistor).

The current through N12 is mirrored in each NDi IGFET, the current sunk by each NDi IGFET being a function of its geometry relative to that of N12. Each NDi IGFET functions as a current generator capable of sinking a predetermined current which normally is an order of magnitude lower than the typical value of the input signal current applied to the circuit input terminal INi. Since the NDi transistors function as current sources, the effective impedance of their source-to-drain path is relatively high. That is, the pull-down transistors only sink the predetermined current. When the signal current into the input terminal exceeds the pull-down current, the voltage at node 16 rises very quickly. Hence, in sharp contrast to resistive elements the pull-down (or pull-up) transistor is not voltage dependent and limits the loading on the input signal source.

The operation of the diode protection and anti-floating (e.g. pull-down) circuitry is as follows. Diode D1 ensures that any signal applied to the input terminal 11 that is more positive than $V_{DD}$ by $V_F$ volts (where $V_F$ is the forward voltage drop of D1) is clamped to the potential ($V_{DD}$) at terminal 12. Diode D2 ensures that any signal applied to input terminal 11 that is more negative than ground by $V_F$ volts (where $V_F$ is the forward voltage drop of D2) is clamped to the potential (ground) at terminal 14.

The pull-down circuitry has two modes of operation. In one mode, $V_C$ is set "low" turning off ND1 and the other anti-floating pull-down transistors NDi. In the other mode, $V_C$ is set "high" turning on ND1 and the other NDi transistors.

When $V_C$ is low, N11 is turned-off and P11 is turned-on. The turn-on of P1 turns-off P2. There is no current into N12 and no bias voltage is developed. Hence, none of the NDi transistors conduct.

When $V_C$ is "high" P11 is turned-off and N11 is turned-on clamping the gate of P12 at, or close to, ground potential and causing a current $i_B$ to flow through P12 and into the drain-to-source path of N12. A voltage $V_B$ is then generated across the drain/gate and source of N12 which is applied to the gate electrodes of the NDi transistors and to the gate electrode of diode D2. The application of $V_B$ to the gate electrode of ND1 ensures that any leakage current at node 16 is pulled to ground, lowering and maintaining the potential at node 16 below the threshold voltage of N1. N1 thereupon turns-off and P1 turns-on clamping output node 18 to $V_{DD}$. The application of $V_B$ volts to the gate of D2 has no significant effect on the function of the diode. Hence, the gate electrode of D2 can be common to that of ND1.

When ND1 conducts, it sources or draws a current from node 16 to ground which is proportioal to $i_B$ (the current through N12). ND1 as well as the other NDi transistors may be designed to conduct currents of particular values. For example, $i_B$ may be smaller than, equal to, or greater than $i_B$. Each NDi transistor depending on the type of signal source applied to its corresponding input terminal may have a different current carrying capablility. When an input signal is applied to input terminal 11 a very small fraction of the signal will be diverted via ND1 to ground. Hence, the input signal can drive input node 16 high (or low) with very little loading. In the event an open circuit occurs so that terminal 11 tends to float, due to any one of a number of failure nodes, ND1 as noted above will conduct any leakage current flowing into node 16 to ground, thereby pulling node 16 towards ground potential and consequently driving the output of I1 to $V_{DD}$ volts.

Thus, the combination of diodes D1 and D2 and IGFET ND1 functions to prevent the application of excessive potentials to the input terminal and in the event of an open circuit prevents the floating of the input and the gate electrodes of P1 and N1.

As noted above, the gate electrode of the gated diode is common to the gate electrode of its associated pull-down transistor. A significant advantage of this connection is that it enables the manufacture of a gated-diode and its associated pull-up transistor in an area which is essentially equal to the area needed to form the gated diode as illustrated in FIGS. 2–5.

Figure 2:
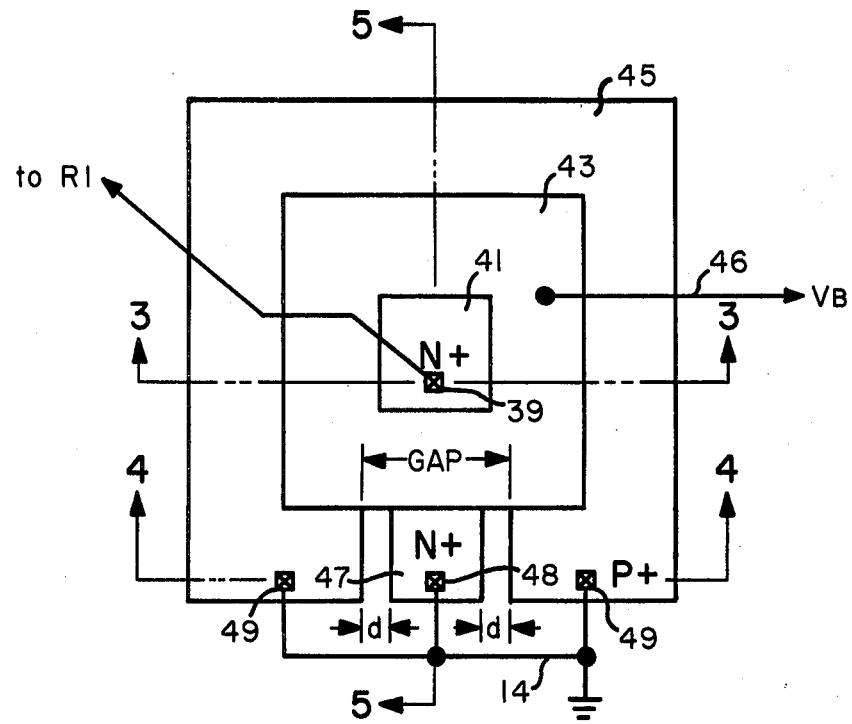
FIG. 2 is a top view of the layout for a combined protection diode and pull-down transistor structure embodying the invention.
Figure 3:
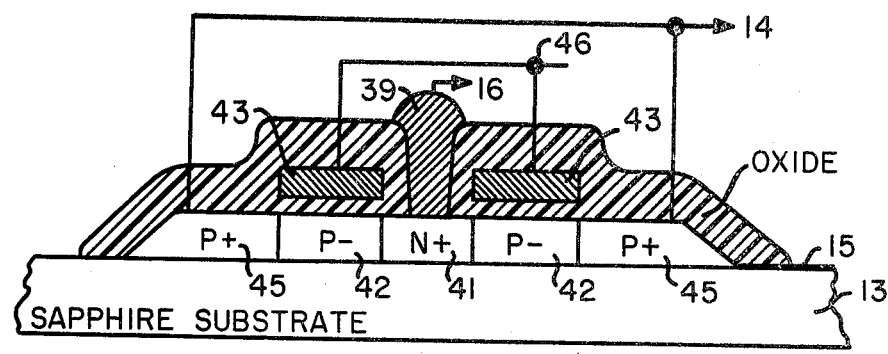
FIG. 3 is a cross sectional view of FIG. 2 taken along line 3—3.
Figure 4:
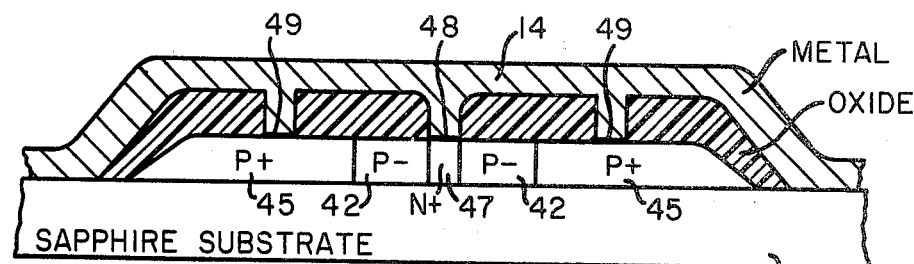
FIG. 4 is a cross sectional view taken along line 4—4 of FIG. 2.
Figure 5:
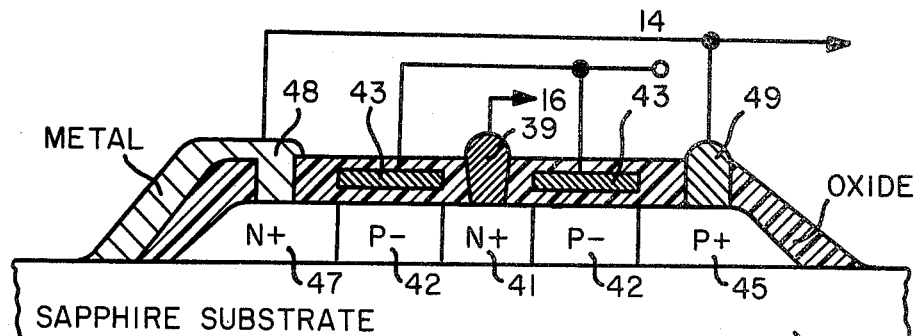
FIG. 5 is a cross sectional view taken along line 5—5 of FIG. 2.

FIG. 2 is a top view of a gate-diode D2 and IGFET ND1 formed in an area no greater than the area needed to form D2. Referring to FIG. 2 there is shown an N+ doped region 41 which functions as the drain of ND1 and the cathode of D2. A contact 39 in region 41 is used to connect region 41 to node 16. Region 41 is surrounded at its surface perimeter by a gate structure 43. The frame like gate structure 43 is insulated from and overlies a channel region 42 of P(−) conductivity (formed between regions 41 and 45 as shown in FIGS. 3, 4, and 5) and has a closed geometry. Gate structure 43 functions as the gate electrode of diode D2 and as the gate electrode of ND1. A conductor 46 connects gate region 43 to the gate/drain of N12 for applying $V_{BIAS}$ to region 43. A conductor 14 connects contact 48 in region 47 to contact 49 in region 45. Conductor 14 may be a conductive strip overlying regions 45 and 47 in an horizontal direction (see FIG. 4). However, for ease of illustration, it is shown as a wire in FIG. 2.

P-region 42 underlying region 43 is surrounded, except for a gap region, by a P+ doped region 45 which functions as the anode of diode D2. An N+ doped region 47 is formed within the gap region and is located a distance "d" from either end of P+ region 45. Region 47 abuts at one of its ends (as shown in FIGS. 2, 4, and 5) region 42 and functions as the source of transistors ND1. A contact 48 in region 47 is connected via a conductor to a contact 49 in region 45, thereby coupling the source of ND1 to the anode of D2.

FIG. 3 shows the diode-IGFET combination formed on a sapphire substrate 13 having a top surface 15. As is known in silicon-on-sapphire (SOS) technology, regions of different conductivity type may be formed by diffusions or ion implantation in an epitaxial layer on the surface 15. Region 41 functions as the cathode of diode D2 and the source of IGFET ND1. Region 42 functions as the channel region of ND1 and diode D2, the overlying gate region 43 functions as the gate electrode of diode D2 and ND1, and region 45 functions as the anode of diode D2.

FIG. 4 shows the interconnection via a metal conductor 14 of contact 48 in region 47 (which is the source of ND1) to contact 49 in anode region of diode D2. This connection ensures that the source electrode of ND1 and the anode of D2 are held at the same potential.

FIG. 5 shows the drain 41 of ND1 separated by channel region 42 from the source 47 of ND1. FIG. 5 also shows the cathode 41 of D2 separated by gate region 42 from the anode 45 of D2. The connection of region 47 to 45 via conductor 14 places the drain-to-source path of ND1 in parallel with the cathode-to-anode path of D2. FIG. 5 also illustrates that the gate region 43 overlies the channel region 42 of ND1 and D2.

As noted earlier, it is important that the source-drain impedance of ND2 be relatively high to prevent loading of the signal source (not shown) connected to input terminal 11. Normally, IGFETs formed with closed geometry structure have a relatively low source-to-drain impedance. However, by making region 47 a relatively thin slice as shown in FIG. 2, ND1 is formed such that it has a high length-to-width ratio and it is thus made to have a relatively high source-drain impedance. It has thus been shown that a slice (GAP region) of outer doughnut 45 can be used to form a small transistor (ND1) in parallel with a gated diode D2 in essentially the same area required to form the protective diode.

Figure 6:
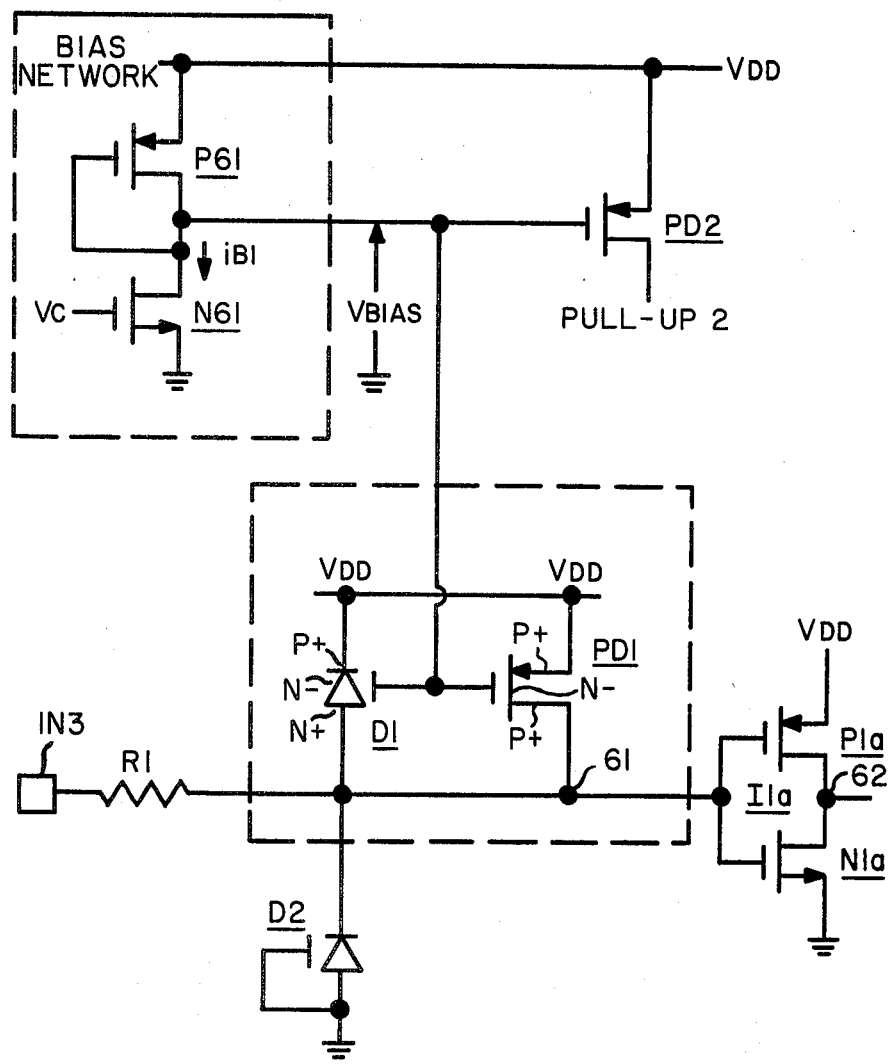
FIG. 6 is a schematic diagram of another circuit embodying the invention.

In the embodiment of FIG. 6 the anti-floating circuitry includes a pull-up transistor (i.e. PD1) in parallel with anti-oxide-rupture gated diode D1. In this instance, the cathode of diode D1 is connected to the source of PD1 and the anode of D1 is connected to the drain of PD1.

The structure of PD1 and D1 is similar to that of ND1 and D2 in FIG. 2 except for the differences in the doping of the various regions. That is, regions corresponding to 41 and 47 are made of P(+) conductivity, region 42 are made of N(−) conductivity, and region 45 is made of N+ conductivity. The contact 39 goes to $V_{DD}$ and the contact 48 and 49 are returned to node 16. The gate region 43 remains common to D1 and PD1, and in an analogous manner to the circuit of FIGS. 2 through 5, PD1 is a small transistor formed in parallel with a gated diode.

The operation of the pull-up circuit of FIG. 6 is similar though complementary to that of FIG. 1. Thus, the bias voltage ($V_{BIAS}$) generated by means of IGFETs P61 and N61 is negative with respect to $V_{DD}$ in order to turn-on the pull-up devices PD1 and PD2. The pull-up devices PDi are designed to mirror the current flowing through IGFET P61 when IGFET N61 is turned-on. When a pull-up device is turned-on, in the absence of an input signal, it supplies sufficient current to drive input node 61 of inverter I1a to a high level, causing its output 62 to go low. As above, the current sourcing of PD1 is sufficiently low that any signal source (not shown) coupled to an input terminal IN3 can easily drive node 61 to ground (or to $V_{DD}$). Note that the control voltage ($V_C$) applied to the gate of N61 (or to node 31 in FIG. 1) may be varied between ground and $V_{DD}$ to increase or decrease the amount of current "sourced" (or "sunk") by the pull-up (or pull-down) IGFETs. $V_C$ may be set at zero volts to ensure that the pull-up or pull-down transistors draw no current. This may be done for example, when it is desired to test the integrated circuit chip to determine the "leakage" of the circuits on the chip.

What is claimed is:

1. A combined gated diode and insulated-gate field-effect transistor (IGFET) comprising:
   a heavily doped first region of first conductivity type;
   a lightly doped second region of second conductivity type enclosing said first region;
   a control electrode isolated from and overlying said second region;
   a heavily doped third region of said second conductivity type substantially surrounding said second region, said third region having a gap;
   said first and third regions forming the anode and cathode of said gated diode;
   a fourth heavily doped region of said first conductivity type formed within said gap, spaced apart from the ends of said third region and abutting said second region, said first and fourth region forming the source and drain of said IGFET, and said control electrode being the common gate electrode of said IGFET and the gate electrode of said gated diode.

2. The combination as claimed in claim 1 wherein said gated diode and IGFET are formed on an insulator substrate.

3. The combination as claimed in claim 1 wherein said first conductivity type is N conductivity, and said second conductivity type is P conductivity.

4. The combination as claimed in claim 1 wherein said control electrode is formed with a highly conductive material.

5. The combination as claimed in claim 1 wherein the regions on either side of said fourth region between said fourth region and the ends of said third region is a lightly doped region of said second conductivity type.

6. For use with a first insulated-gate field-effect transistor (IGFET) having first and second regions defining the ends of a conduction channel and having a gate electrode insulated from and overlying said conduction channel a combined protection and control circuit for protecting the gate insulator against rupture and for preventing the gate electrode from floating comprising:
   a gated diode having an anode region, a cathode region, and a third region between said anode and cathode over which is formed a gate electrode isolated from said third region;
   a second IGFET having source and drain regions defining the ends of a conduction channel and having a gate electrode isolated from said conduction channel;
   means connecting the anode to cathode regions of said gated diode in parallel with the source-to-drain path of said second IGFET between the gate electrode of said first IGFET and a first point of operating potential; and means coupling the gate electrode of said second IGFET to the gate electrode of said diode.

7. The combination as claimed in claim 6 further including;
a bias source comprised of a third IGFET having its source connected to the source of said second IGFET, the drain and gate of said third IGFET being connected in common to a bias current source, and means connecting the drain/gate of said third IGFET to the gate electrode of said second IGFET.

8. The combination as claimed in claim 6 wherein said drain of said second IGFET is connected to the cathode of said diode, and wherein the source of said second IGFET is connected to the anode of said diode.

9. The combination as claimed in claim 6 wherein said drain of said second IGFET is connected to the anode of said diode and wherein the source of said second IGFET is connected to the cathode of said diode.

* * * * *

UNITED STATES PATENT AND TRADEMARK OFFICE
CERTIFICATE OF CORRECTION

PATENT NO. : 4,408,245
DATED : October 4, 1983
INVENTOR(S) : Richard L. Pryor

It is certified that error appears in the above-identified patent and that said Letters Patent is hereby corrected as shown below:

Col. 1, line 40, change "knon" to - - - known - - -.
Col. 1, line 54, change "impendance" to - - - impedance - - -.
Col. 5, line 24, after "region" insert - - - 45 - - -.

Signed and Sealed this

Seventeenth Day of April 1984

[SEAL]

Attest:

GERALD J. MOSSINGHOFF

Attesting Officer   Commissioner of Patents and Trademarks